(12) United States Patent
Li et al.

(10) Patent No.: US 12,557,577 B2
(45) Date of Patent: *Feb. 17, 2026

(54) METHOD OF FORMING SEMICONDUCTOR DEVICE USING WET ETCHING CHEMISTRY

(71) Applicant: Taiwan Semiconductor Manufacturing Company, Ltd., Hsinchu (TW)

(72) Inventors: Meng-Hsien Li, Hsinchu (TW); Ying-Chuen Wang, Taichung (TW); Chieh-Yi Shen, Taipei (TW); Li-Min Chen, Hsinchu County (TW); Ming-Hsi Yeh, Hsinchu (TW); Kuo-Bin Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/749,534

(22) Filed: Jun. 20, 2024

(65) Prior Publication Data
US 2024/0339327 A1   Oct. 10, 2024

Related U.S. Application Data

(63) Continuation of application No. 17/703,997, filed on Mar. 25, 2022, now Pat. No. 12,046,476.

(51) Int. Cl.
| | |
|---|---|
| *H01L 21/306* | (2006.01) |
| *C09K 13/00* | (2006.01) |
| *C23F 1/00* | (2006.01) |
| *C23F 1/10* | (2006.01) |

(Continued)

(52) U.S. Cl.
CPC ........ *H01L 21/30608* (2013.01); *C09K 13/00* (2013.01); *C23F 1/00* (2013.01); *C23F 1/10* (2013.01); *H01L 21/3081* (2013.01); *H01L 21/3083* (2013.01); *H01L 21/76813* (2013.01); *H01L 21/76829* (2013.01)

(58) Field of Classification Search
CPC .......... H01L 21/30608; H01L 21/3081; H01L 21/3083; H01L 21/76813; H01L 21/76829; H01L 21/31111; H01L 21/31144; H01L 21/76807; H01L 21/76814; H01L 21/02063; C09K 13/00; C23F 1/00; C23F 1/10
USPC ......................................................... 438/745
See application file for complete search history.

(56) References Cited

U.S. PATENT DOCUMENTS

| | | | |
|---|---|---|---|
| 6,417,112 B1 * | 7/2002 | Peyne | ............... H01L 21/02063 257/E21.582 |
| 8,772,109 B2 | 7/2014 | Colinge | |
| 8,785,285 B2 | 7/2014 | Tsai et al. | |

(Continued)

*Primary Examiner* — Duy Vu N Deo
(74) *Attorney, Agent, or Firm* — JCIPRNET

(57) ABSTRACT

A wet etching chemistry to selectively remove a polymer residue on an opening embedded in a low-k dielectric layer and an underlying stop layer in a process of forming an interconnect structure is provided. The wet etching chemistry includes: two type of organic solvents, wherein a concentration of the two type of organic solvents is greater than or equal to 70%; an Alkali source amine, at least comprising a tertiary amine; an inhibitor; and water. In some embodiment, the wet etching chemistry is free of a peroxide to avoid damage to the WdC hard mask.

20 Claims, 6 Drawing Sheets

(51) Int. Cl.
*H01L 21/308* (2006.01)
*H01L 21/768* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 12,046,476 B2 * | 7/2024 | Li .................... H01L 21/76829 |
| 2019/0079409 A1 * | 3/2019 | Takahashi ............ C11D 7/5022 |
| 2020/0105598 A1 * | 4/2020 | Yang ................ H01L 21/31053 |

* cited by examiner

METHOD OF FORMING SEMICONDUCTOR DEVICE USING WET ETCHING CHEMISTRY

CROSS-REFERENCE TO RELATED APPLICATION

This application is a continuation application of and claims the priority benefit of a prior application Ser. No. 17/703,997, filed on Mar. 25, 2022, now allowed. The entirety of the above-mentioned patent application is hereby incorporated by reference herein and made a part of this specification.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, copper-based interconnect structures typically implemented in multilayer interconnect (MLI) features have presented performance, yield, and cost challenges as MLI features become more compact with ever-shrinking IC feature size. For example, the traditional wet etch/clean chemistry used in the process of forming the MLI features usually contain peroxide which results in the damage of the tungsten-doped carbon (WdC) hard mask. The said damage would result in the poor metal-filling capability, thereby affecting the reliability of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
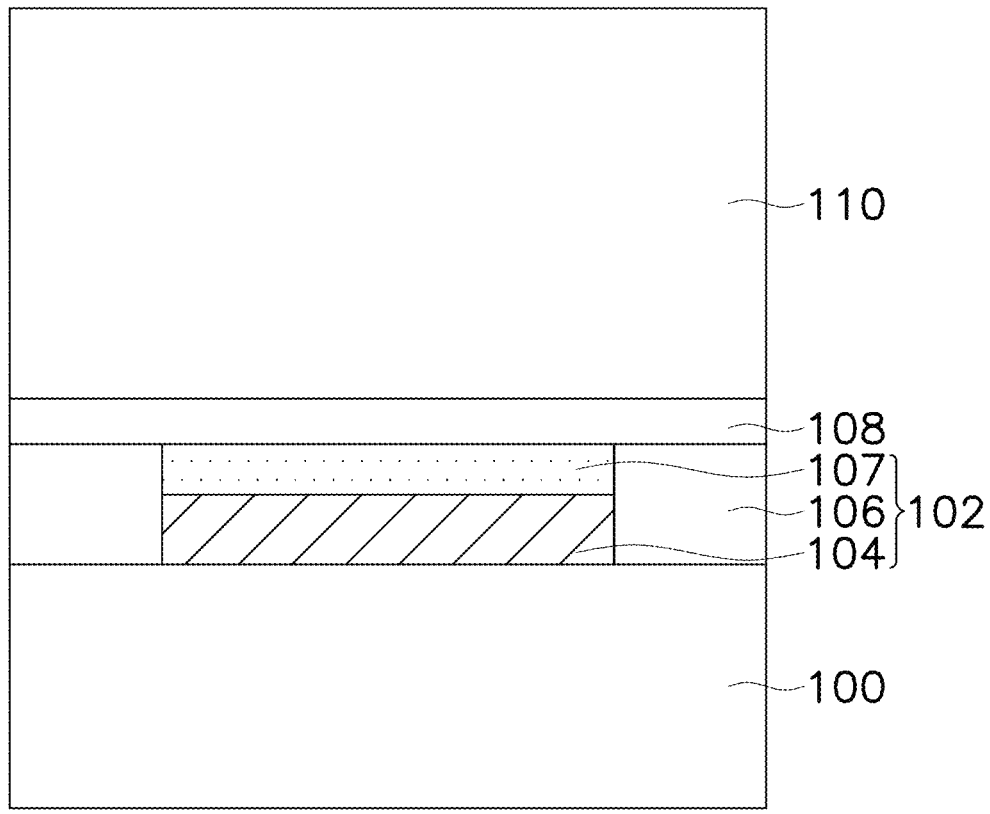
FIG. 1A to FIG. 1E are cross-sectional views illustrating various stages of a method of fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the Figures The spatially relative terms are intended to encompass different orientations of the device in use or operation in addition to the orientation depicted in the Figures The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a cross-sectional view illustrating one stage of a method of fabricating a semiconductor device 10 in accordance with some embodiments of the disclosure. Referring to FIG. 1A, a substrate 100 is provided. The substrate 100 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the substrate 100 includes a crystalline silicon substrate (e.g., wafer). In some alternative embodiments, the semiconductor substrate 100 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The substrate 100 may include various doped regions depending on design requirements (e.g., p-type semiconductor substrate or n-type semiconductor substrate). The doped regions may be doped with p-type or n-type dopants. For example, the doped regions may be doped with p-type dopants, such as boron (B) or BF2; n-type dopants, such as phosphorus (P) or arsenic (As); and/or a combination thereof. The dopant concentration in various doped regions may be different.

In some embodiments, the substrate 100 includes a plurality of electrical components (not shown) formed in a device region thereof in the front-end-of-line (FEOL) processing of semiconductor manufacturing. The electrical components may include an active device (e.g., a transistor, a diode, or the like) and/or a passive device (e.g., a capacitor, an inductor, a resistor, or the like). The transistor may be a planar metal-oxide-semiconductor field-effect transistor (MOSFET), a FinFET, a nanostructure transistor, a gate-all-around transistor (e.g. nanowire, nanosheet, or the like), etc. The transistor may be formed by gate-first processes or gate-last processes.

As illustrated in FIG. 1A, a first interconnect structure 102 may be formed on the substrate 100. In detail, the first interconnect structure 102 may include a metal structure (104/107) embedded in a dielectric layer 106. The metal structure may include a metal layer 104 and a cap layer 107 overlying a top surface of the metal layer 104. In some embodiments, the material of the dielectric layer 106 includes silicon oxide (SiOx), silicon nitride (SiNx), silicon oxynitride (SiON), phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the material of the dielectric layer 106 includes a low-k dielectric material. The dielectric layer 106 may include one or more dielectric materials and/or one or more dielectric layers. In some embodiments, the dielectric layer 106 is formed to a suitable thickness by Flowable Chemical Vapor Deposition (FCVD), thermal chemical vapor deposition (CVD), High Density Plasma Chemical Vapor Deposition (HDPCVD), Sub Atmospheric Chemical Vapor Deposition (SACVD), spin-on, sputtering, or other suitable methods. In some embodiments, the material of the metal layer 104 may include copper (Cu), cobalt (Co), ruthenium (Ru), or a combination thereof. The metal layer 104 may be formed by a plating process, CVD, plasma enhanced chemical vapor deposition (PECVD), physical vapor deposition (PVD), a combination thereof, or the like. In some embodiments, the cap layer 107 may include a metal material different from the metal layer 104, such as cobalt (Co), ruthenium (Ru), or a combination thereof. Besides, the metal layer 104 in the first interconnect structure 102 may be electrically connected to the device region in the substrate 100 by the metal routing (not shown).

As illustrated in FIG. 1A, an etch stop layer 108 may be formed over the first interconnect structure 102, so that the first interconnect structure 102 is disposed between the substrate 100 and the etch stop layer 108. In some embodiments, the etch stop layer 108 may be a single-layered structure or a multi-layered structure, such as a bi-layered structure, a tri-layered structure, or a four-layered structure etc. In some embodiments, the thickness of the single-layered structure or the thickness of each layer of multi-layered structure ranges from 5 angstrom (Å) to 150 Å. The material of the etch stop layer 108 may include silicon oxide, silicon nitride, silicon carbon nitride (SiCN), silicon carbon oxide (SiCO), silicon carbide (SIC), metal oxide (e.g., AlOx, TiOx, ZnOx, MnOx etc.), metal nitride (e.g., AlNx), metal oxynitride (e.g., AlOxNy, TiOxNy etc.) or a combination thereof. The etch stop layer 108 may be formed by PECVD, plasma enhanced atomic layer deposition (PEALD), CVD, thermal ALD, PVD, a combination thereof, or the like.

When the etch stop layer 108 is provided with a multi-layered structure, the lower portion and the upper portion of the etch stop layer 108 are formed with different materials with different etching selectivity. For example, when the etch stop layer 108 is provided with a bi-layered structure, the lower portion of the etch stop layer 108 includes AlOxNy, and the upper portion of the etch stop layer 108 includes SiCO or SiC. For example, when the etch stop layer 108 is provided with a tri-layer structure, the lower portion of the etch stop layer 108 includes AlOxNy, the middle portion of the etch stop layer 108 includes SiCO, and the upper portion of the etch stop layer 108 includes AlOx. For example, when the etch stop layer 108 is provided with a four-layer structure, the etch stop layer 108 includes, from bottom to top, AlOxNy, SiCO, AlOx and SiCO.

A dielectric layer 110 is formed on the etch stop layer 108, so that the etch stop layer 108 is disposed between the first interconnect structure 102 and the dielectric layer 110. In some embodiments, the dielectric layer 110 may be a low-k dielectric layer which has a dielectric constant less than 3.9. For example, the dielectric constant of the dielectric layer 110 ranges from 2.6 to 3.8, such as 2.7, 2.8, 2.9, 3.0, 3.1, 3.2, 3.3, 3.4, 3.5, 3.6, or 3.7, including any range between any two of the preceding values. In some embodiments, the dielectric layer 110 includes a porous dielectric material. In some embodiments, the dielectric layer 110 includes elements such as Si, O, C, N and/or H. For example, the dielectric layer 110 includes SiOCH, SiOC, SiOCN or a combination thereof. In some embodiments, the dielectric layer 110 includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The dielectric layer 110 may include one or more dielectric materials and/or one or more dielectric layers. The dielectric layer 110 may be formed to a suitable thickness by PECVD, PEALD, spin coating, a combination thereof, or the like.

Figure 1B:
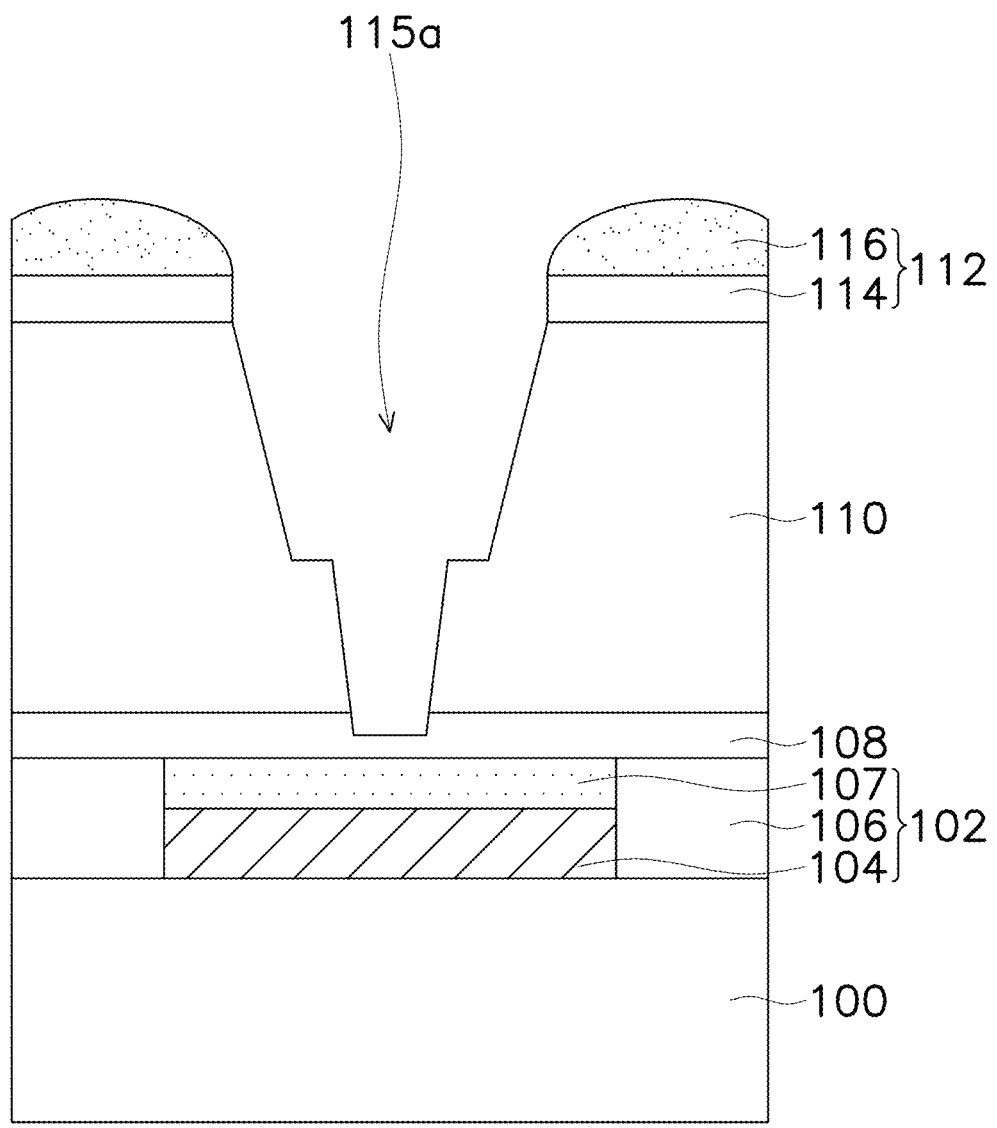

FIG. 1B is a cross-sectional view illustrating one stage of a method of fabricating a semiconductor device 10 in accordance with some embodiments of the disclosure. Referring to FIG. 1B, a patterned hard mask layer 112 may be formed on the dielectric layer 110. In some embodiments, the material of the patterned hard mask layer 112 includes silicon oxide, silicon nitride, silicon carbide, amorphous carbon, a photoresist material, tungsten-doped carbon (WdC), tungsten nitride (WN), titanium nitride (TiN), a suitable hard mask material, or a combination thereof. In some embodiments, the patterned hard mask layer 112 may be a single-layered structure. In some alternative embodiments, the patterned hard mask layer 112 may be a multi-layered structure. For example, the patterned hard mask layer 112 includes a lower mask layer 114 and an upper mask layer 116. The material of the lower mask layer 114 may include silicon oxide, such as tetraethoxysilane (TEOS). The material of the upper mask layer 116 may include tungsten-doped carbon (WdC), tungsten nitride (WN), titanium nitride (TiN), or a combination thereof. The patterned hard mask layer 112 may be formed by performing deposition, lithography, and etching processes. In the present embodiment, the upper mask layer 116 is a WdC layer which provides good etching selectivity especially to a low-k dielectric material, so that the subsequently formed opening (e.g., 115a or 115) have better critical dimension (CD) control. In addition, the WdC layer can improve small via etch capability due to WdC lower by-product boiling point, easier by-product removal, and less by-product accumulated at via bottom. That is, the WdC layer may effectively reduce the via under-etching issue with via shrinkage and reduced via resistance failure rate significantly. Therefore, the etching using WdC as a hard mask would become the trend of back end of line (BEOL) intermetal process for advanced technology node development.

Figure 1C:
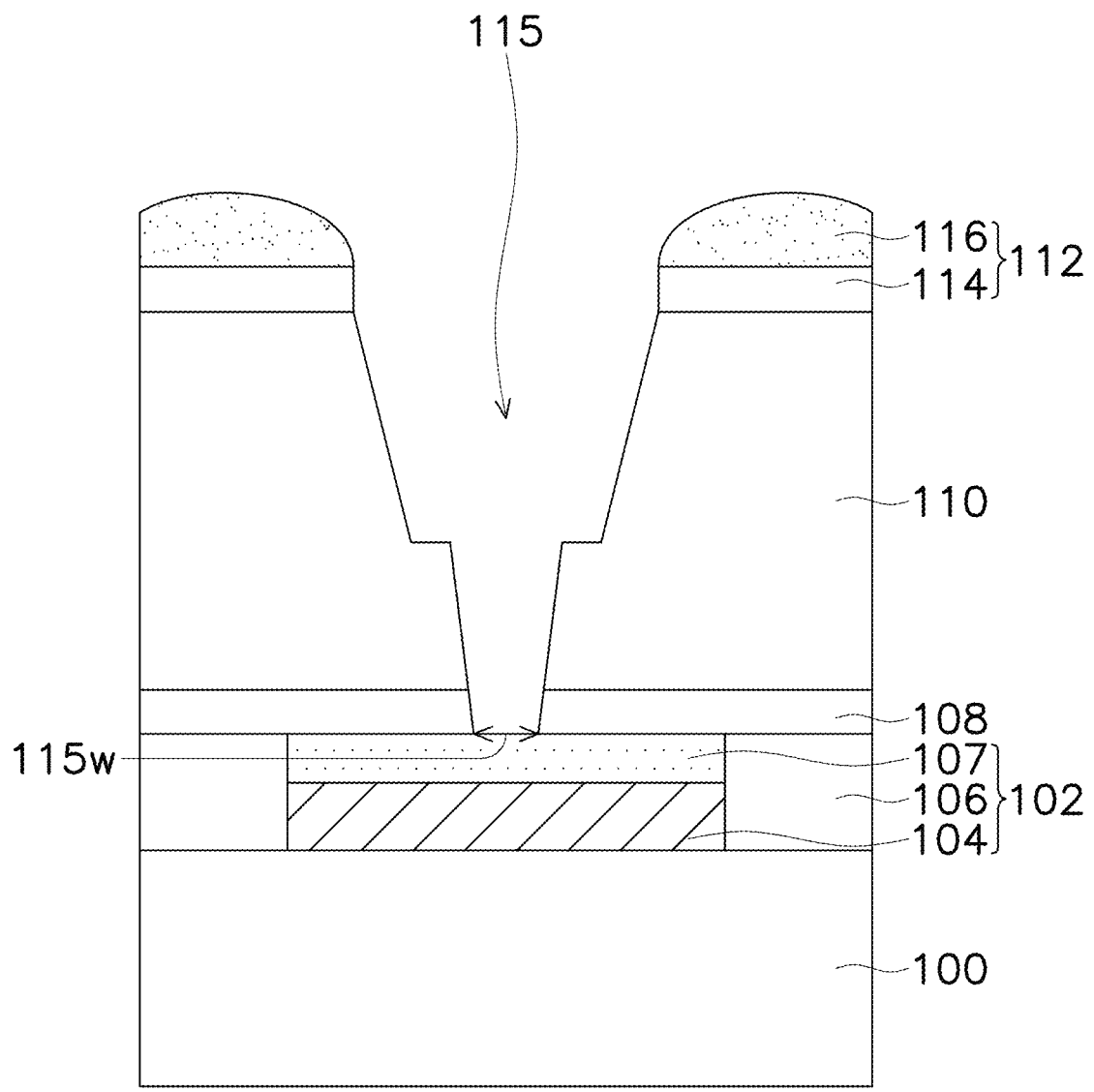

As illustrated in FIG. 1B and FIG. 1C, a patterning process may be performed on the dielectric layer 110 and the etch stop layer 108 by using the patterned hard mask layer 112 as a mask, thereby forming an opening 115 penetrating through the dielectric layer 110 and the etch stop layer 108 to reach the cap layer 107. In detail, the patterning process may include a dry etching process and a wet etching process. The dry etching process may be first performed to remove a portion of the dielectric layer 110 and a portion of the etch stop layer 108 by using the patterned hard mask layer 112 as an etch mask, thereby forming an opening 115a stopped on the etch stop layer 108, as shown in FIG. 1B. In some embodiments, the opening 115a may be stopped on the top surface of the etch stop layer 108 or partially into the etch stop layer 108, but not reveal the underlying cap layer 107. In some embodiments, the dry etching process may include an inductively coupled plasma (ICP)) etching process, a reactive-ion etching (RIE) process, any suitable etching process, which includes one or more etching steps.

Next, the wet etching process may be performed by using a wet etching chemistry to selectively etch or remove the remaining etch stop layer 108 under the opening 115a, thereby extending the opening 115a down and reach the cap layer 107 of the metal structure. As shown in FIG. 1C, in the present embodiment, the opening 115 is formed as a dual damascene opening. In some embodiments, the opening 115 may be formed by via-first process, trench-first process, or double patterning process. In some alternative embodiments, the opening 115 is a single damascene opening.

It should be noted that, in some embodiments, the wet etching chemistry include an organic solvent matrix, a buffer system, an inhibitor, and water. In detail, the organic solvent matrix may include two type of organic solvents. In some embodiments, a concentration of the two type of organic solvents is greater than or equal to 60%. The concentration of the two type of organic solvents may be between 60% and 80%, such as 61%, 62%, 63%, 64%, 65%, 66%, 67%, 68%, 69%, 70%, 71%, 72%, 73%, 74%, 75%, 76%, 77%, 78%, or 79%, including any range between any two of the preceding values. In some embodiments, the two type of organic solvents include a first organic solvent and a second organic solvent different from the first organic solvent. The first organic solvent may include ethylene glycol butyl ether (EGBE), diethylene glycol monobutyl ether (DEGBE), or a combination thereof; and the second organic solvent may include ethylene glycol (EG), diethylene glycol (DEG), or a combination thereof. In some embodiments, the first organic solvent has a first concentration greater than a second concentration of the second organic solvent. For example, the first concentration of the first organic solvent may be between 50% and 80%, such as 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, or 79%, including any range between any two of the preceding values. The second concentration of the second organic solvent may be between 1% and 10%, such as 2%, 3%, 4%, 5%, 6%, 7%, 8%, or 9% including any range between any two of the preceding values. The second organic solvent may be referred to as co-solvent to provide the function as surfactant. The first organic solvent may have a polarity lower than a polarity of the second organic solvent. The organic solvent matrix with different polarities and greater concentration is able to provide the excellent wetting and swelling/penetration capability for organic polymer and photoresistor, i.e., the good carbon-rich polymer dissolution. In this case, the polymer residue and/or the photoresistor after the dry etching process can be easily cleaned by the wet etching chemistry without remaining on the bottom of the opening 115. In addition, the organic solvent matrix may have a larger molecular weight than that of water. Therefore, the organic solvent matrix would be not easy to intrude into the dielectric layer 110 (e.g., low-k and/or ultra-low-k dielectric layer) than the water, thereby reducing the damage to the dielectric layer 110. That is, the organic solvent matrix may be referred to as the passivator of the dielectric layer 110.

In some embodiments, the buffer system includes a first amine and a second amine. The first amine may include a tertiary amine, such as triethanolamine (TEA), triethylamine (TEN), or a combination thereof. The concentration of the first amine may be between 1% and 10%, such as 2%, 3%, 4%, 5%, 6%, 7%, 8%, or 9%, including any range between any two of the preceding values. It should be noted that the tertiary amine may provide the good heavy polymer bonding (C—C, C—F, C=O) dissection and effectively remove MOx-rich residues by nucleophilic substitution. Specifically, during the dry etching process of removing the dielectric layer 110 and the etch stop layer 108, the metal ions (e.g., Al) in the etch stop layer 108 will bond with the carbon/fluoride/oxygen ions in the dielectric layer 110 to form some polymer residues. The tertiary amine in the wet etching chemistry may have the good nucleophilic ability and may be referred to as a nucleophile for the nucleophilic substitution with the polymer residues. In this case, the polymer residues may be decomposed in the wet etching chemistry and may be cleaned by the wet etching chemistry. That is, in the present embodiment, the wet etching chemistry may provide the excellent cleaning efficiency for the organic polymer residues to avoid the organic polymer residues accumulation on the bottom of the opening 115. In addition, compared with the quaternary amine (e.g., Tetramethylammonium hydroxide (TMAH)), the tertiary amine of the present embodiment would not cause excessive damage to the dielectric layer 110 (e.g., low-k and/or ultra-low-k dielectric layer). In some embodiments, the second amine may include N-Methylmorpholine (NMM), 3-morpholinopropylamine or a combination thereof. The concentration of the second amine may be between 1% and 10%, such as 2%, 3%, 4%, 5%, 6%, 7%, 8%, or 9%, including any range between any two of the preceding values. In the present embodiment, the buffer system may be referred to as Alkali source amine, which can adjust a pH value of the wet etching chemistry to be greater than or equal to 10. The pH value of the wet etching chemistry may be between 10 and 11, such as 10.1, 10.2, 10.3, 10.4, 10.5, 10.6, 10.7, 10.8, or 10.9, including any range between any two of the preceding values. In addition, the Alkali source amine may have a boiling point greater than or equal to 100° C.

With regard to the buffer system, as the wet etching process progresses, the wet etching chemistry tends to lose its "strength" (etching ability) due to the consumption of its chemicals. In addition, the formation of byproducts, which are diluted into the wet etching chemistry, can also compromise its effectiveness over time. In some embodiments, a buffer system with high boiling point can mitigate these issues. As would be understood by a person of ordinary skill in the art, a buffer system is a solution that provides pH stability during the etching process regardless whether a base or an acid is added. According to some embodiments, the buffer system can provide alkalinity to the solution to sustain the chemical reactions and to retain polymer etching selectivity. That is, the buffer system with high boiling point can ensure the pH value and alkalinity stability of the wet etching chemistry remains constant and does not change from batch to batch. According to some embodiments, solvents that are already present in the wet etching chemistry can also act as a buffer system. By way of example and not limitation, TEA of about 10% and NMM of about 10% are major components in the buffer system, which remains the pH value of the wet etching chemistry about 10.5, so as to keep alkaline source dissociation in safe range for metal (e.g., the underlying cap layer 107) protection.

In some embodiments, the inhibitor includes benzotriazole (BTA), tolytriazole (TTA) or a combination thereof. The inhibitor may prevent the corrosion and damage of the underlying cap layer 107 (e.g., cobalt layer) and the metal layer 104 (e.g., cupper layer). In some embodiments, a concentration of the inhibitor is between 0.1% and 3.0%; and a concentration of water is between 10% and 40%.

It should be noted that, in the present embodiment, the wet etching chemistry is free of a peroxide and a chelator. The peroxide in the conventional wet etching chemistry would result in the WdC hard mask material damage, which may degrade WdC profile (e.g., recess or kink). In this case, the conductive material subsequently formed in the opening 115 may cause the poor filling-in issue due to WdC recess or kink profile, thereby forming the voids in the conductive features and reducing the reliability of the device. In addition, the chelator in the conventional wet etching chemistry would damage the underlying cap layer 107 (e.g., cobalt layer) and metal layer 104 (e.g., copper layer). In the present embodiment, the wet etching chemistry free of the peroxide and the chelator can solve these issues.

In some embodiments, an etching rate of the wet etching chemistry to the stop layer 108 may be greater than an etching rate of the wet etching chemistry to the cap layer 107. That is, the wet etching chemistry may etch the remaining etch stop layer 108 under the opening 115a, but does not damage or less damage the underlying cap layer 107. In such embodiment, the aluminum-containing residue would not remain on the bottom of the opening 115 and cause an increase in the resistance of the subsequently formed via.

In some alternative embodiments, the opening 115a after the dry etching process may reach the top surface of the cap layer 107, but not damage the cap layer 107. In such embodiment, the subsequent wet etching process may be regarded as a wet cleaning process, and the wet etching chemistry used in the wet etching process may be regarded as a wet clean chemistry. Specifically, the wet etching chemistry may clean and remove the residues overlying the surface of the damascene opening and the top surface of the cap layer 107 without damaging the WdC hard mask 116, the low-k dielectric layer 110, the cobalt cap layer 107, and the copper metal layer 104.

Figure 2:
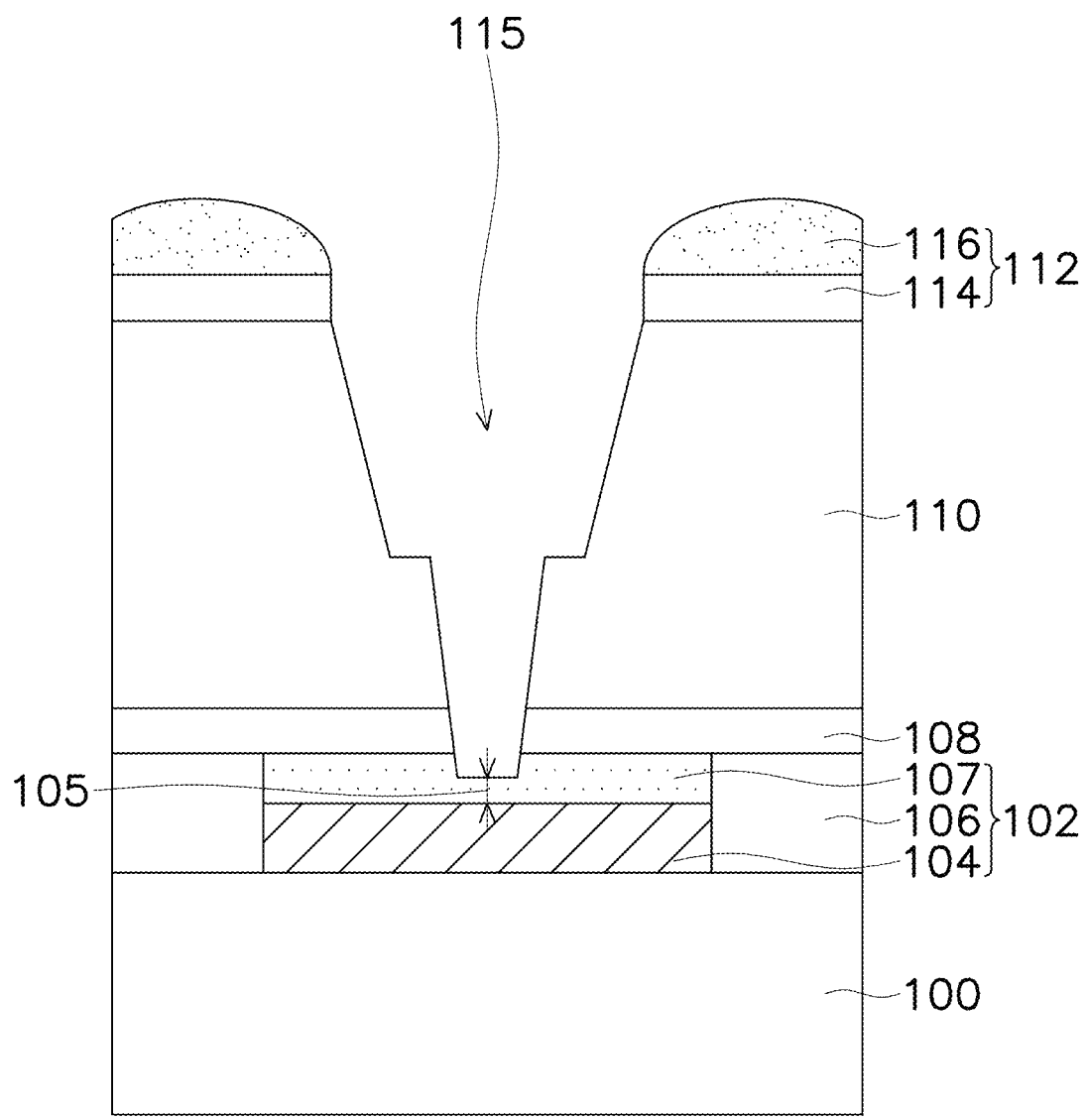
FIG. 2 is a cross-sectional view illustrating a semiconductor device in accordance with some alternative embodiments of the disclosure.

In some embodiments, the opening 115 after the wet etching process is referred to as a dual damascene opening, as shown in FIG. 1C. In detail, the opening 115 may have a narrower via opening and a wider trench opening on the via opening. The via opening and the trench opening are spatially connected to each other. In some embodiments, the via opening and the trench opening both have tapered sidewalls, but the embodiments of the present disclosure are not limited thereto. In other embodiments, the sidewalls of the via opening and the trench opening may be vertical sidewalls. In some embodiments, the opening 115 has a bottom width 115w in a range of 11.5 nm and 14.5 nm. Although the opening 115 illustrated in FIG. 1C may stop on the top surface of the cap layer 107, the embodiments of the present disclosure are not limited thereto. In some alternative embodiments, the opening 115 may extend partially into the cap layer 107 to form a recess in the cap layer 107, as shown in FIG. 2. A distance 105 is included between the bottom surface of the opening 115 and the top surface of the metal layer 104. In some embodiments, the distance 105 is between 13 Å and 17 Å. In other word, the opening 115 may be recessed in the cap layer 107, but not reach the underlying metal layer 104.

Figure 1D:
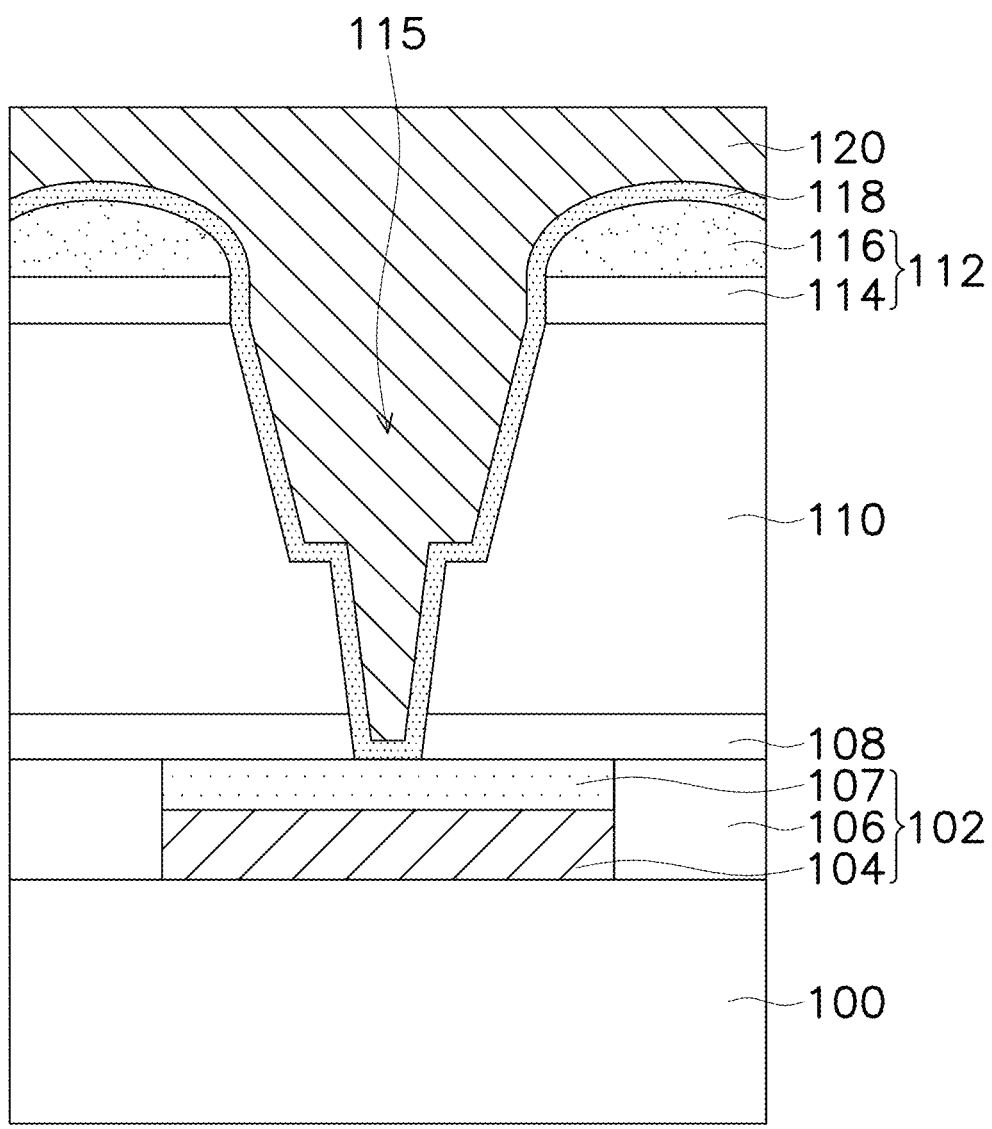

FIG. 1D is a cross-sectional view illustrating one stage of a method of fabricating a semiconductor device 10 in accordance with some embodiments of the disclosure. Referring to FIG. 1D, a barrier material 118 may be formed in the opening 115 and on the patterned hard mask layer 112. In some embodiments, the barrier material 118 is conformally formed along the sidewalls and bottoms of the opening 115 and the top surface of the patterned hard mask layer 112. The barrier material 118 may include tantalum (Ta), tantalum nitride (TaN), titanium (Ti), titanium nitride (TiN) or a combination thereof. The barrier material 118 may be formed by, for example, PVD or ALD. It should be noted that the barrier material 118 illustrated in FIG. 1D may be omitted in some alternative embodiments.

As illustrated in FIG. 1D, a conductive material 120 may be formed in the opening 115. In some embodiments, the conductive material 120 is formed on the barrier material 118. The conductive material 120 may include copper (Cu), ruthenium (Ru), cobalt (Co), or a combination thereof. The conductive material 120 may be formed by a plating process, CVD, PECVD, PVD, a combination thereof, or the like.

Figure 1E:
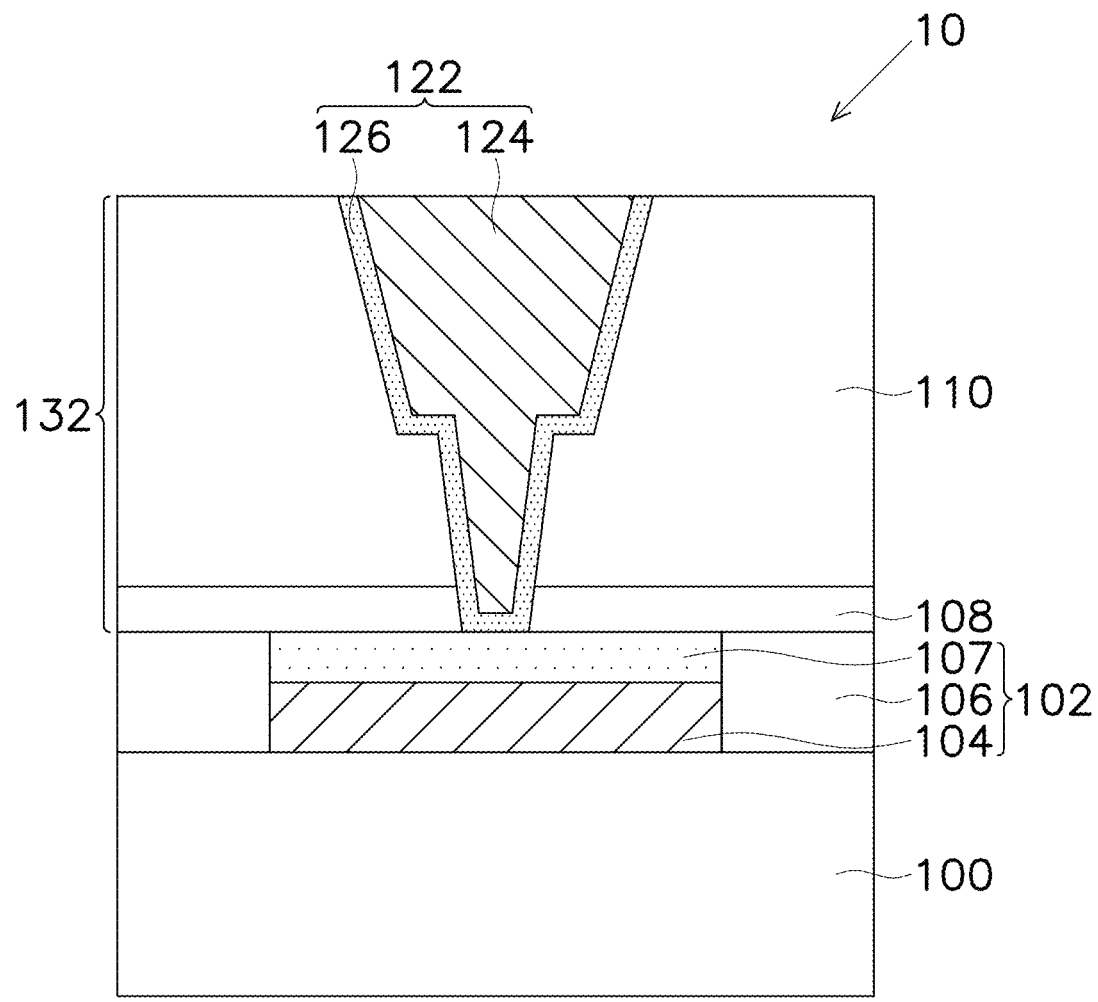

FIG. 1E is a cross-sectional view illustrating one stage of a method of fabricating a semiconductor device 10 in accordance with some embodiments of the disclosure. Referring to FIG. 1D, a planarization process such as a chemical mechanical polishing (CMP) process may be performed to form a conductive feature 122 in the opening 115, thereby accomplishing a second interconnect structure 132. In some embodiments, the planarization process is performed on the conductive material 120 to remove a portion of the conductive material 120 outside the opening 115, thereby forming a conductive layer 124 in the opening 115. The conductive layer 124 may be embedded in the dielectric layer 110 and the etch stop layer 108. The planarization process may be performed to the barrier material 118 to remove a portion of the barrier material 118 outside the opening 115, thereby forming a barrier layer 126 between the conductive layer 124 and the dielectric layer 110, between the conductive layer 124 and the etch stop layer 108, and between the conductive layer 124 and the first interconnect structure 102. In some embodiments, the patterned hard mask layer 112 is completely removed in the above planarization process. In some embodiments, the conductive feature 122 in the second interconnect structure 132 may be disposed on the first interconnect structure 102 and physically and/or electrically connected to the metal structure (107/104) in first interconnect structure 102. Although a method of forming the conductive layer 124 and the barrier layer 126 is described by taking the above method as an example, the disclosure is not limited thereto. In some embodiments, a grinding process is performed instead of the mentioned CMP process. In some embodiments, an etching back process may be performed in combination with the mentioned polishing or grinding process. In some embodiments, the conductive feature 122 may be a dual damascene structure (as shown in FIG. 1E). In some alternative embodiments, the conductive layer 124 may be a single damascene structure.

In some embodiments, the metal layer 104 is referred to as the metal 0 (M0), the upper portion of the conductive feature 122 is referred to as the metal 1 (M1), and the lower portion of the conductive feature 122 is referred to as the via 0 (V0). However, the embodiments of the present disclosure are not limited thereto. In some alternative embodiments, the metal layer 104 is referred to as the metal n-1 (Mn-1), the upper portion of the conductive feature 122 is referred to as the metal n (Mn), and the lower portion of the conductive feature 122 is referred to as the via n-1 (Vn-1). That is, the wet etching chemistry used in the patterning process (including one dry etching process and one wet etching process (DW)) can be applied to form any level of metal interconnects in the BEOL process, especially used to selectively remove the organic polymer residue on the damascene opening in the low-k dielectric layer and the underlying stop layer.

In some embodiments, an exemplary wet etching chemistry may include at least 70% EGBE, no more than 5% EG, no more than 10% TEA, no more than 10% NMM, at least 0.5% BTA, and at least 20% water. According to some embodiments, an exemplary wet etching process with a process temperature of 59° C. and using the wet etching chemistry with the pH value of 10.5 can have an aluminum oxide etch rate about 2.8 Å/min, a WdC etch rate lower than 1.0 Å/min, and a cobalt etch rate about 0.9 Å/min. In such embodiment, the exemplary wet etching chemistry can efficiently clean and remove the residues overlying the surface of the opening 115 and the top surface of the cap layer 107 without damaging the WdC hard mask 116, the low-k dielectric layer 110, the cobalt cap layer 107, and the copper metal layer 104. As would be understood by a person of ordinary skill in the art, the aforementioned combination of chemicals, their concentration percentages in the solution, and the resulting etch selectivity ratios are not intended to be limiting and are provided only as an example. As a result, other chemical combinations, alternative concentrations and resulting etch selectivity ratios are possible.

According to some embodiments, a wet etching chemistry includes two type of organic solvents, wherein a concentration of the two type of organic solvents is greater than or equal to 70%; a buffer system, at least comprising a tertiary amine; an inhibitor; and water.

In some embodiments, the concentration of the two type of organic solvents is between 60% and 80%. In some embodiments, the two type of organic solvents include: a first organic solvent, comprising ethylene glycol butyl ether (EGBE), diethylene glycol monobutyl ether (DEGBE), or a combination thereof; and a second organic solvent, comprising ethylene glycol (EG), diethylene glycol (DEG), or a combination thereof, wherein the first organic solvent has a first concentration greater than a second concentration of the second organic solvent. In some embodiments, the buffer system includes: a first amine, comprising the tertiary amine of triethanolamine (TEA), triethylamine (TEN), or a combination thereof; and a second amine comprising N-Methylmorpholine (NMM), 3-morpholinopropylamine or a combination thereof. In some embodiments, the wet etching chemistry has a pH value greater than or equal to 10. In some embodiments, the wet etching chemistry is free of a peroxide and a chelator. In some embodiments, the buffer system has a boiling point greater than or equal to 100° C.

According to some embodiments, a method of forming a semiconductor device includes: forming a metal structure on a substrate; forming a stop layer, a dielectric layer, and a patterned hard mask layer in sequence on the metal structure; performing a dry etching process by using the patterned hard mask layer as mask to form an opening penetrating through the dielectric layer and partially extending into the stop layer; and performing a wet etching process by using a wet etching chemistry to extend the opening down and reach the metal structure, wherein the wet etching chemistry comprises: an organic solvent matrix, wherein a concentration of the organic solvent matrix is greater than or equal to 60%; an Alkali source amine, at least comprising a tertiary amine; an inhibitor; and water.

In some embodiments, the metal structure includes: a metal layer comprising copper, cobalt, ruthenium, or a combination thereof; and a cap layer overlying the metal layer and comprising a metal material different from the metal layer. In some embodiments, the cap layer includes cobalt, ruthenium, or a combination thereof. In some embodiments, an etching rate of the wet etching chemistry to the stop layer is greater than an etching rate of the wet etching chemistry to the cap layer. In some embodiments, a material of the stop layer comprises silicon oxide, silicon nitride, silicon carbon nitride (SiCN), silicon carbon oxide (SiCO), silicon carbide (SiC), metal oxide, metal nitride, metal oxynitride, or a combination thereof. In some embodiments, a material of the patterned hard mask layer comprises silicon oxide, silicon nitride, silicon carbide, amorphous carbon, tungsten-doped carbon (WdC), tungsten nitride (WN), titanium nitride (TiN), or a combination thereof. In some embodiments, the method further includes: forming a barrier material to cover a surface of the opening and a top surface of the metal structure, and a top surface of the patterned hard mask layer; forming a conductive material on the barrier material to fill in the opening; and performing a planarization process to remove a portion of the barrier material, a portion of the conductive material, and the patterned hard mask layer to expose the dielectric layer, thereby forming a conductive feature being in contact with the metal structure. In some embodiments, the Alkali source amine includes: a first amine, comprising a tertiary amine of triethanolamine (TEA), triethylamine (TEN), or a combination thereof; and a second amine comprising N-Methylmorpholine (NMM), 3-morpholinopropylamine or a combination thereof, and the Alkali source amine adjusts a pH value of the wet etching chemistry to be greater than or equal to 10.

According to some embodiments, a wet etching chemistry to selectively remove a polymer residue on an opening embedded in a low-k dielectric layer and an underlying stop layer in a process of forming an interconnect structure, the wet etching chemistry including: two type of organic solvents, wherein a concentration of the two type of organic solvents is greater than or equal to 70%; an Alkali source amine, at least comprising a tertiary amine; an inhibitor; and water.

In some embodiments, the two type of organic solvents include: a first organic solvent, comprising ethylene glycol butyl ether (EGBE), diethylene glycol monobutyl ether (DEGBE), or a combination thereof; and a second organic solvent, comprising ethylene glycol (EG), diethylene glycol (DEG), or a combination thereof, wherein the first organic solvent has a polarity lower than a polarity of the second organic solvent. In some embodiments, the Alkali source amine includes: a first amine, comprising the tertiary amine of triethanolamine (TEA), triethylamine (TEN), or a combination thereof; and a second amine comprising N-Methylmorpholine (NMM), 3-morpholinopropylamine or a combination thereof, and the Alkali source amine adjusts a pH value of the wet etching chemistry to be greater than or equal to 10. In some embodiments, the wet etching chemistry is free of a peroxide and a chelator. In some embodiments, the Alkali source amine has a boiling point greater than or equal to 100° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a metal structure on a substrate;
    forming a stop layer, a dielectric layer, and a patterned hard mask layer in sequence on the metal structure;
    performing a dry etching process by using the patterned hard mask layer as mask to form an opening penetrating through the dielectric layer and partially extending into the stop layer; and
    performing a wet etching process by using a wet etching chemistry to extend the opening down and reach the metal structure, wherein the wet etching chemistry comprises:
        an organic solvent matrix, wherein a concentration of the organic solvent matrix is greater than or equal to 70%;
        an Alkali source amine, at least comprising a tertiary amine;
        an inhibitor; and
        water.

2. The method according to claim 1, wherein the metal structure comprises:
    a metal layer comprising copper, cobalt, ruthenium, or a combination thereof; and
    a cap layer overlying the metal layer and comprising a metal material different from the metal layer.

3. The method according to claim 2, wherein the cap layer comprises cobalt, ruthenium, or a combination thereof.

4. The method according to claim 2, wherein an etching rate of the wet etching chemistry to the stop layer is greater than an etching rate of the wet etching chemistry to the cap layer.

5. The method according to claim 1, wherein a material of the stop layer comprises silicon oxide, silicon nitride, silicon carbon nitride (SiCN), silicon carbon oxide (SiCO), silicon carbide (SiC), metal oxide, metal nitride, metal oxynitride, or a combination thereof.

6. The method according to claim 1, wherein a material of the patterned hard mask layer comprises silicon oxide, silicon nitride, silicon carbide, amorphous carbon, tungsten-doped carbon (WdC), tungsten nitride (WN), titanium nitride (TiN), or a combination thereof.

7. The method according to claim 1, further comprising:
    forming a barrier material to cover a surface of the opening and a top surface of the metal structure, and a top surface of the patterned hard mask layer;
    forming a conductive material on the barrier material to fill in the opening; and
    performing a planarization process to remove a portion of the barrier material, a portion of the conductive material, and the patterned hard mask layer to expose the dielectric layer, thereby forming a conductive feature being in contact with the metal structure.

8. The method according to claim 1, wherein the Alkali source amine comprises:
    a first amine, comprising a tertiary amine of triethanolamine (TEA), triethylamine (TEN), or a combination thereof; and
    a second amine comprising N-Methylmorpholine (NMM), 3-morpholinopropylamine or a combination thereof, and the Alkali source amine adjusts a pH value of the wet etching chemistry to be greater than or equal to 10.

9. The method according to claim 1, wherein the inhibitor comprises benzotriazole (BTA), and a concentration of the inhibitor is between 0.1% and 3.0%.

10. The method according to claim 1, wherein the wet etching chemistry is free of a peroxide and a chelator.

11. A method of forming an interconnect structure, comprising:
    forming a stop layer, a dielectric layer, and a tungsten-doped carbon (WdC) layer on a metal layer;
    performing a dry etching process by using the WdC layer as mask to form an opening penetrating through the dielectric layer and partially extending into the stop layer; and
    performing a wet etching process by using a wet etching chemistry to extend the opening down and reach the metal layer, wherein the wet etching chemistry is free of a peroxide and a chelator, and is configured to remove a polymer residue.

12. The method according to claim 11, wherein the wet etching chemistry comprises:
    two type of organic solvents, wherein a concentration of the two type of organic solvents is greater than or equal to 70%;
    a buffer system, at least comprising a tertiary amine; and
    an inhibitor.

13. The method according to claim 12, wherein the inhibitor comprises benzotriazole (BTA), and a concentration of the inhibitor is between 0.1% and 3.0%.

14. The method according to claim 12, wherein the two type of organic solvents comprises:
    a first organic solvent, comprising ethylene glycol butyl ether (EGBE), diethylene glycol monobutyl ether (DEGBE), or a combination thereof; and
    a second organic solvent, comprising ethylene glycol (EG), diethylene glycol (DEG), or a combination thereof, wherein the first organic solvent has a first concentration greater than a second concentration of the second organic solvent.

15. The method according to claim 12, wherein the buffer system has a boiling point greater than or equal to 100° C.

16. The method according to claim 11, wherein the wet etching chemistry has a pH value greater than or equal to 10.

17. The method according to claim 11, further comprising:
    forming a barrier material to cover a surface of the opening and a top surface of the metal layer, and a top surface of the WdC layer;
    forming a conductive material on the barrier material to fill in the opening; and performing a planarization process to remove a portion of the barrier material, a portion of the conductive material, and the WdC layer to expose the dielectric layer, thereby forming a conductive feature being in contact with the metal layer.

18. A method of forming an interconnect structure, comprising:

forming a stop layer and a low-k dielectric layer, and a tungsten-doped carbon (WdC) hard mask in order;

forming an opening in the stop layer and the dielectric layer, wherein the opening has a polymer residue thereon; and performing a wet etching process by using a wet etching chemistry to selectively remove the polymer residue on the opening, wherein wet etching chemistry comprises:
two type of organic solvents;
a buffer system; and
an inhibitor, wherein the wet etching chemistry is free of a peroxide and a chelator to protect the WdC hard mask on the low-k dielectric layer from damaging.

19. The method according to claim 18, wherein the inhibitor comprises benzotriazole (BTA), and a concentration of the inhibitor is between 0.1% and 3.0%.

20. The method according to claim 18, wherein a concentration of the organic solvent matrix is greater than or equal to 70%.

* * * * *